(12) United States Patent
Perry et al.

(10) Patent No.: US 6,952,255 B2
(45) Date of Patent: Oct. 4, 2005

(54) SYSTEM AND METHOD FOR INTEGRATED MULTI-USE OPTICAL ALIGNMENT

(75) Inventors: Andrew Perry, Fremont, CA (US); Robert Steger, Los Altos, CA (US); Neil Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/636,086

(22) Filed: Aug. 6, 2003

(65) Prior Publication Data

US 2005/0030524 A1 Feb. 10, 2005

(51) Int. Cl.$^7$ ............................. G01B 11/26; G01C 1/00
(52) U.S. Cl. ............................. 356/141.2; 356/139.03; 356/140; 356/620; 356/622
(58) Field of Search ............................. 356/140–141.5, 356/152.3, 620, 622, 139.03; 438/7, 16, 29–32, 69, 72

(56) References Cited

U.S. PATENT DOCUMENTS

| | | | | |
|---|---|---|---|---|
| 4,469,949 A | | 9/1984 | Mori et al. ............... 250/491.1 |
| 4,861,162 A | * | 8/1989 | Ina ............................ 356/401 |
| 4,952,060 A | * | 8/1990 | Ina et al. ..................... 356/401 |
| 5,815,594 A | * | 9/1998 | Tanaka ........................ 382/151 |
| 6,590,634 B1 | * | 7/2003 | Nishi et al. .................. 355/53 |

FOREIGN PATENT DOCUMENTS

EP      1 265 107 A2    11/2002    ............. G03F/9/00

* cited by examiner

Primary Examiner—Bernarr E. Gregory
Assistant Examiner—Isam Alsomiri
(74) Attorney, Agent, or Firm—Martine Penilla & Gencarella, LLP

(57) ABSTRACT

An optical alignment system for use in a semiconductor processing system is provided. The optical alignment system includes a wafer chuck that has an alignment feature integrated into the top surface of the wafer chuck. In addition, a beam-forming system, which is capable of emitting an optical signal onto the alignment feature, is disposed above the wafer chuck. Also, a detector is included that can detect an amplitude of the optical signal emitted onto the alignment feature. In one aspect, the alignment feature can be a reflective alignment feature that reflects a portion of the optical signal back to the beam detector. In additional aspect, the alignment feature can be a transmittance alignment feature capable of allowing a portion of the optical signal to pass through the wafer chuck to the detector. In this aspect, the detector can be disposed below the wafer chuck.

21 Claims, 6 Drawing Sheets

SYSTEM AND METHOD FOR INTEGRATED MULTI-USE OPTICAL ALIGNMENT

BACKGROUND OF THE INVENTION

1. Field of the Invention

This invention relates generally to optical alignment, and more particularly to integrated multi-use optical alignment for interferometric and reflectometer based endpoint and optical metrology systems.

2. Description of the Related Art

In the manufacture of semiconductor devices, such as integrated circuits or flat panel displays, the substrate (e.g., the wafer or the glass panel) may be processed in a plasma processing chamber. Processing may include the deposition of layers of materials on the substrate and the selective etching of the deposited layer(s). To prepare a layer for etching, the substrate surface typically is masked with an appropriate photoresist or hard mask. A plasma is formed from an appropriate etchant source gas during etching to etch through regions unprotected by the mask. The etching is terminated once it is determined that the target layer is etched through or has reached a predetermined thickness. This termination of the etch is typically referred to as the etch "endpoint."

Many techniques have been employed in the art to determine when to terminate an etch. For example, in interferometry, a light beam reflected off the substrate is monitored and an etching depth is determined by counting maxima and minima in the amplitude of the reflected beam or from cessation of the signal. The constructive and destructive interference occurs because the light beam is partially reflected off the substrate surface and partially reflected off underlying interfaces. If the original thickness of the layer is known, a remaining thickness may be estimated by counting the maxima/minima peaks during etching.

Interferometric and reflectometer based endpoint and optical metrology systems on semiconductor processing tools typically rely on the accurate alignment of a beam of optical radiation with the normal to the surface of a wafer under test. When optimal alignment is achieved, the incident bean is reflected back into the transmission/collection optics of the optical system and the maximum possible signal strength is achieved.

In order to achieve this alignment, some form of alignment procedure is performed that involves placing a reference wafer on the electrode of the processing system and adjusting the alignment of the optics until the back-reflected signal is at a maximum. For example, FIG. 1 is a diagram illustrating a prior art etch system 100 utilizing an optical endpoint detection system. The etch system 100 includes a process chamber 102 having a wafer chuck 104 and a view port 106. The view port 106 allows an optical beam 110 to be transmitted onto the surface of a reference wafer 112 using a beam-forming system 108.

To properly align the optical beam 110 emitted from the beam-forming system 108, the reference wafer 112 is placed onto the wafer chuck 104. The optical beam 110 then is emitted onto the surface of the reference wafer 112 and the signal reflected is back to the beam-forming system is examined. Broadly speaking, the beam-forming system 108 is adjusted until the reflected is maximized at all wavelengths being utilized. Unfortunately, this procedure interrupts normal process flow because the reference wafer 112 must be loaded into the processing chamber.

Another type of alignment step also is required while a tool is being brought into production or serviced. The robot arm that transfers wafers into the processing chamber should be aligned accurately relative to the position of the electrode within the chamber. This alignment required complex test fixtures and careful measurement. For example, in one process, a reference plate is placed on the wafer chuck 104 and corresponding reference plate is positioned on the robot arm. The robot arm then is manually adjusted until the robot arm is aligned with the reference plate. The final coordinates thereafter are programmed into the robot arm control system such that the robot knows the location of the center of the wafer chuck 104. To perform this operation, both the transport module where the robot operates and the process chamber have to be vented in order to properly position the reference plates. Because it is a time consuming process, re-alignment of the robot arm generally is only repeated if wafers are broken or otherwise obviously misplaced on the electrode.

In view of the foregoing, there is a need for an optical alignment system that allows optical alignment without requiring the normal process flow to be interrupted. In addition, the system should allow proper robot alignment without requiring venting of the process chamber and transport module.

SUMMARY OF THE INVENTION

Broadly speaking, the present invention addresses these needs by providing an integrated multi-use optical alignment system that allows optical alignment without interrupting the normal process flow. In one embodiment, an optical alignment system for use in a semiconductor processing system is disclosed. The optical alignment system includes a wafer chuck having an alignment feature integrated into the top surface of the wafer chuck. In addition, a beam-forming system, which is capable of emitting an optical signal onto the alignment feature, is disposed above the wafer chuck. Further, a detector is included that can detect an amplitude of the optical signal emitted onto the alignment feature. In one aspect, the alignment feature can be a reflective alignment feature that reflects a portion of the optical signal back to the beam detector. In an additional aspect, the alignment feature can be a transmittance alignment feature capable of allowing a portion of the optical signal to pass through the wafer chuck to the detector. In this aspect, the detector can be disposed below the wafer chuck.

A method for optical alignment in a semiconductor processing system is disclosed in a further embodiment of the present invention. The method includes emitting an optical signal onto an alignment feature integrated into the center of a wafer chuck. An amplitude of the optical signal emitted onto the alignment feature is detected, and a beam-forming system is adjusted to maximize the amplitude of the detected optical signal. As above, the alignment feature can be a reflective alignment feature that reflects a portion of the optical signal back to a detector, which can be located with the beam-forming system, or a transmittance alignment feature that allows a portion of the optical signal to pass through the wafer chuck to the detector.

In an additional embodiment, a system is disclosed for aligning a robot arm in a semiconductor processing system. The system includes a wafer chuck that has an alignment feature integrated into the center of the top surface of the wafer chuck. A beam-forming system is disposed above the wafer chuck, and is capable of emitting an optical signal onto the alignment feature. To align the robot arm, a robot alignment wafer having a reference pattern disposed in a central location of the robot alignment wafer is placed on the robot arm and inserted into the processing chamber. A detector that detects an amplitude of the optical signal emitted onto the reference pattern then is utilized to determine the alignment of the robot arm. In general, the reference pattern alters the optical signal such that a center of the robot alignment wafer can be determined relative to a center of the wafer chuck. For example, the reference pattern can be a circular spectral reference pattern that includes a plurality of bandpass filters in separate segments of the pattern. In this example, each bandpass filter is centered at a unique wavelength. Another exemplary reference pattern can be a linear aperture pattern that includes a plurality of circular apertures in a line along a direction of travel of the robot arm when the robot arm inserts the robot alignment wafer into the processing chamber. To increase accuracy a mutli-line linear aperture pattern can be utilized that includes a plurality of linear aperture patterns, each further including a bandpass filter centered at a unique wavelength. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an integrated multi-use optical alignment system that allows optical alignment without requiring the normal process flow to be interrupted. In addition, embodiments of the present invention allow proper robot alignment without requiring venting of the process chamber and transport module. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
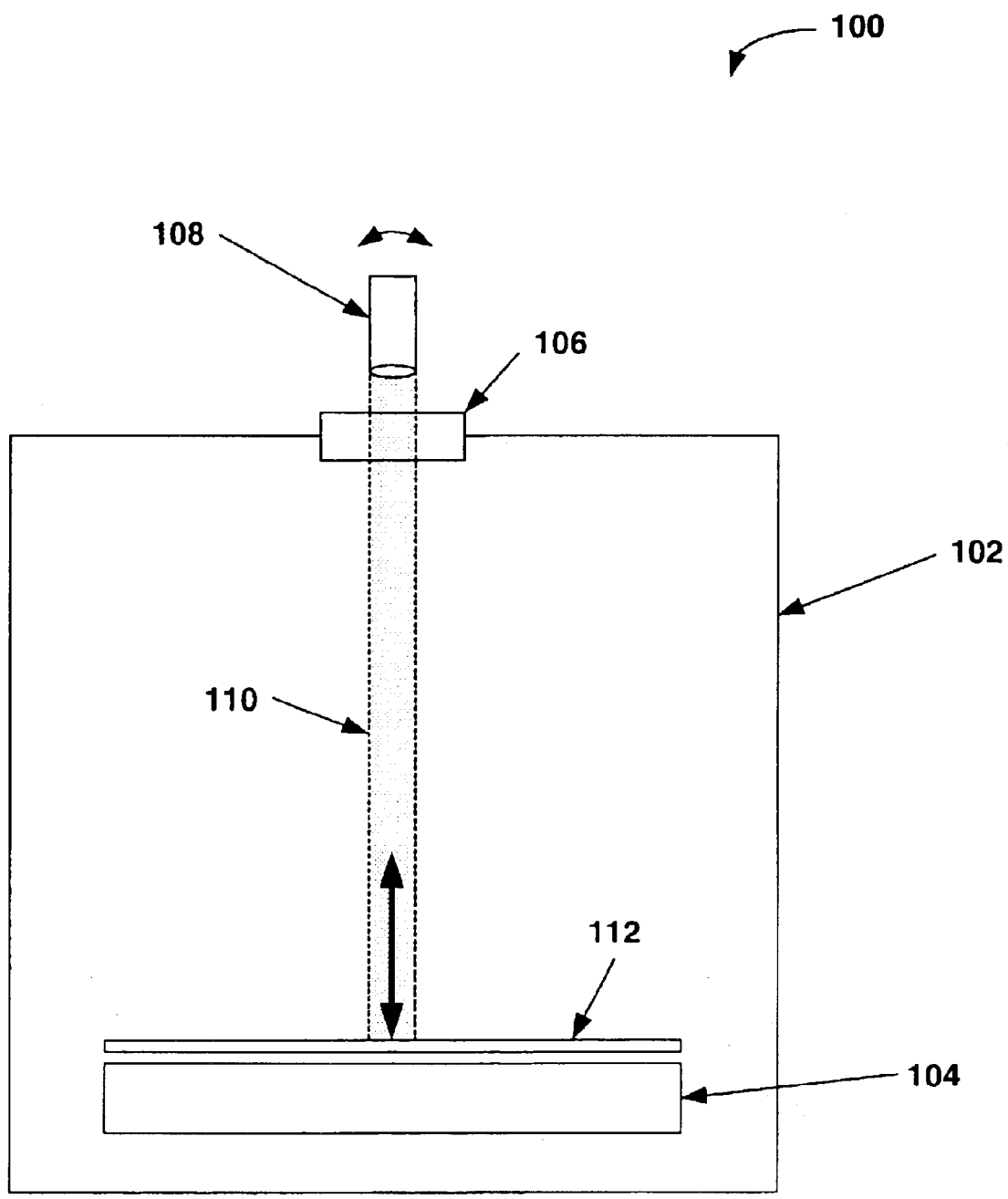
FIG. 1 is a diagram illustrating a prior art etch system utilizing an optical endpoint detection system.
Figure 2:
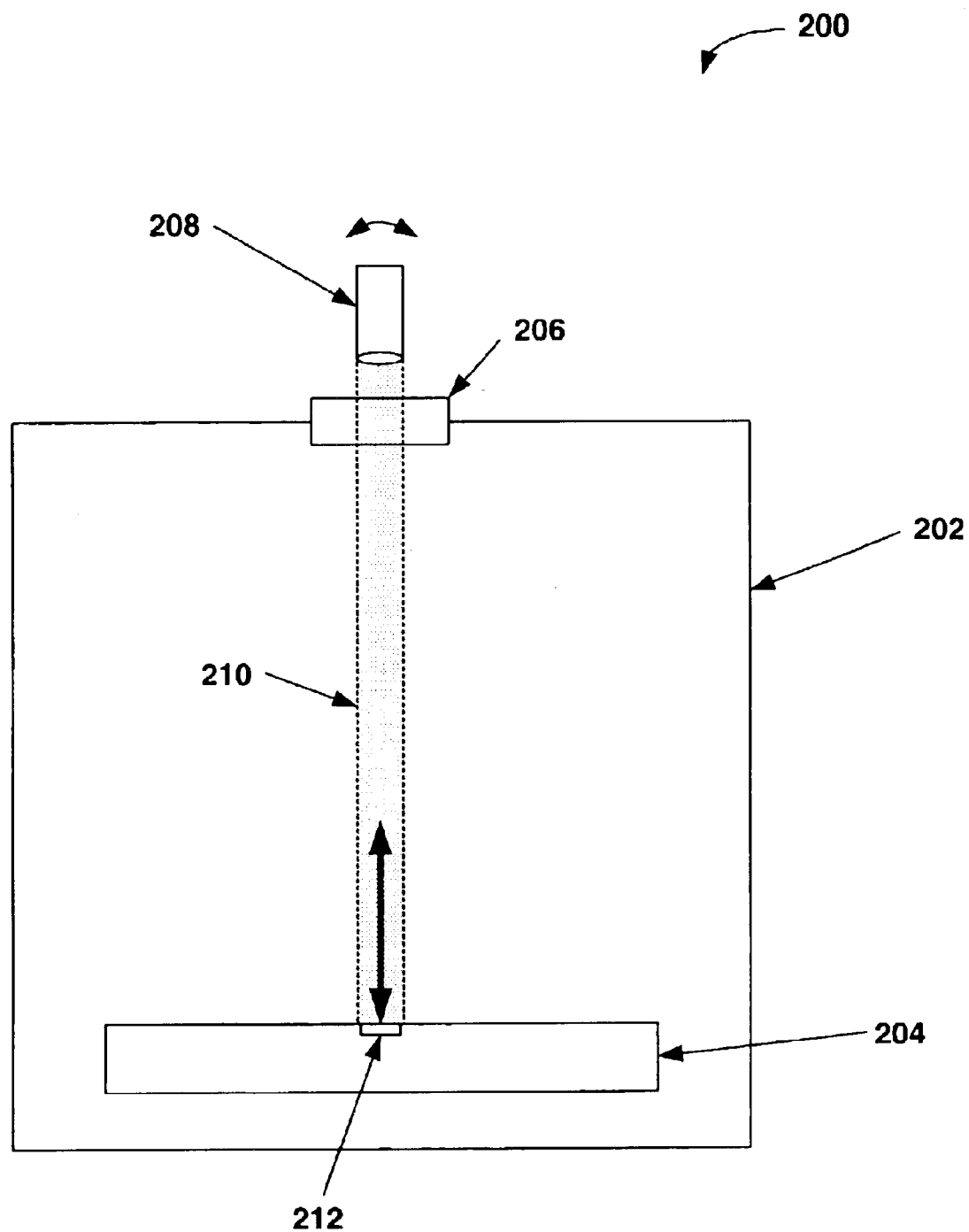
FIG. 2 is a diagram showing an etch system having an integrated multi-use optical alignment system based on reflectance, in accordance with an embodiment of the present invention.

FIG. 1 was described in terms of the prior art. FIG. 2 is a diagram showing an etch system 200 having an integrated multi-use optical alignment system based on reflectance, in accordance with an embodiment of the present invention. The etch system 200 includes a process chamber 202 having a view port 206 and a wafer chuck 204. The wafer chuck includes an alignment feature, which in FIG. 2 is a reflective alignment feature 212, to facilitate alignment of the optical beam 210. The view port 206 allows an optical beam 210 to be transmitted onto the surface of the wafer chuck 204 using a beam-forming system 208.

In the embodiment of FIG. 2, a small reflective alignment feature 212 is formed in the center region of the wafer chuck 204. The reflective alignment feature 212 is parallel with the surface of the wafer chuck 204, thus mimicking the effect of having a wafer on the wafer chuck 204. The reflective alignment feature 212 can be created using a plurality of different techniques. In one embodiment, the reflective alignment feature 212 is formed by polishing a small region on the surface of the wafer chuck 204 to be smooth. In this embodiment, the reflective alignment feature 212 can be polished as one contiguous region or as a checkerboard pattern of sub-regions. In this manner, no foreign material is added to the surface of the wafer chuck 204, thus reducing contamination risk. In addition, polishing of the wafer chuck surface requires a minimum number of additional steps during fabrication. Further, because chuck materials have been extensively tested, the reflective alignment feature 212 can be fabricated to have a long effective life.

In a further embodiment, the reflective alignment feature 212 can be a small cylinder of transparent optical material, such as sapphire. The cylinder is embedded, using for example a semiconductor grade adhesive, into a recess bored into the center of the wafer chuck 204 and the lower face of the cylinder can be aluminum coated. The adhesive and sapphire serve to protect the aluminum coating from attack by the plasma and ensure that no aluminum gets into the processing chamber. To avoid the use of a metallic coating, the sapphire can be utilized without the aluminum because the refractive index of sapphire is high enough to produce a significant surface reflection. Further, the lower face of the cylinder can be beveled to produce a retroreflector.

To properly align the optical beam 210 emitted from the beam-forming system 208, the optical beam 210 is emitted onto the reflective alignment feature 212 on the surface of the wafer chuck 204 and the signal reflected back to the beam-forming system is examined. The beam-forming system 208 general includes a light source and a light detection mechanism. For example, an optical fiber can be used to provide light to the beam-forming system, and another optical fiber can be used to receive the light reflected from the reflective alignment feature 212 and provide the received light to a light detector. The beam-forming system 208 then is adjusted until the reflected light signal is maximized at all wavelengths being utilized.

In this manner, alignment of the beam-forming system 208 can be undertaken at anytime when the etch system 200 is idle, such as between wafers or during a waferless clean operation. Over time, the alignment of the beam-forming system 208 can drift as a result of vibration of the process chamber and heat/cooling operations. Because the reflective alignment feature 212 is built into the wafer chuck 204, the alignment of the beam-forming system 208 can be checked, for example, each time a wafer is unloaded. That is, each time a wafer is unloaded from the process chamber 202, the wafer chuck 204 is bare and thus the reflective alignment feature 212 can be used to align the beam-forming system 208. Furthermore, the beam-forming system can be aligned without interrupting the normal process flow because the alignment can occur between wafer etch operations.

Figure 3:
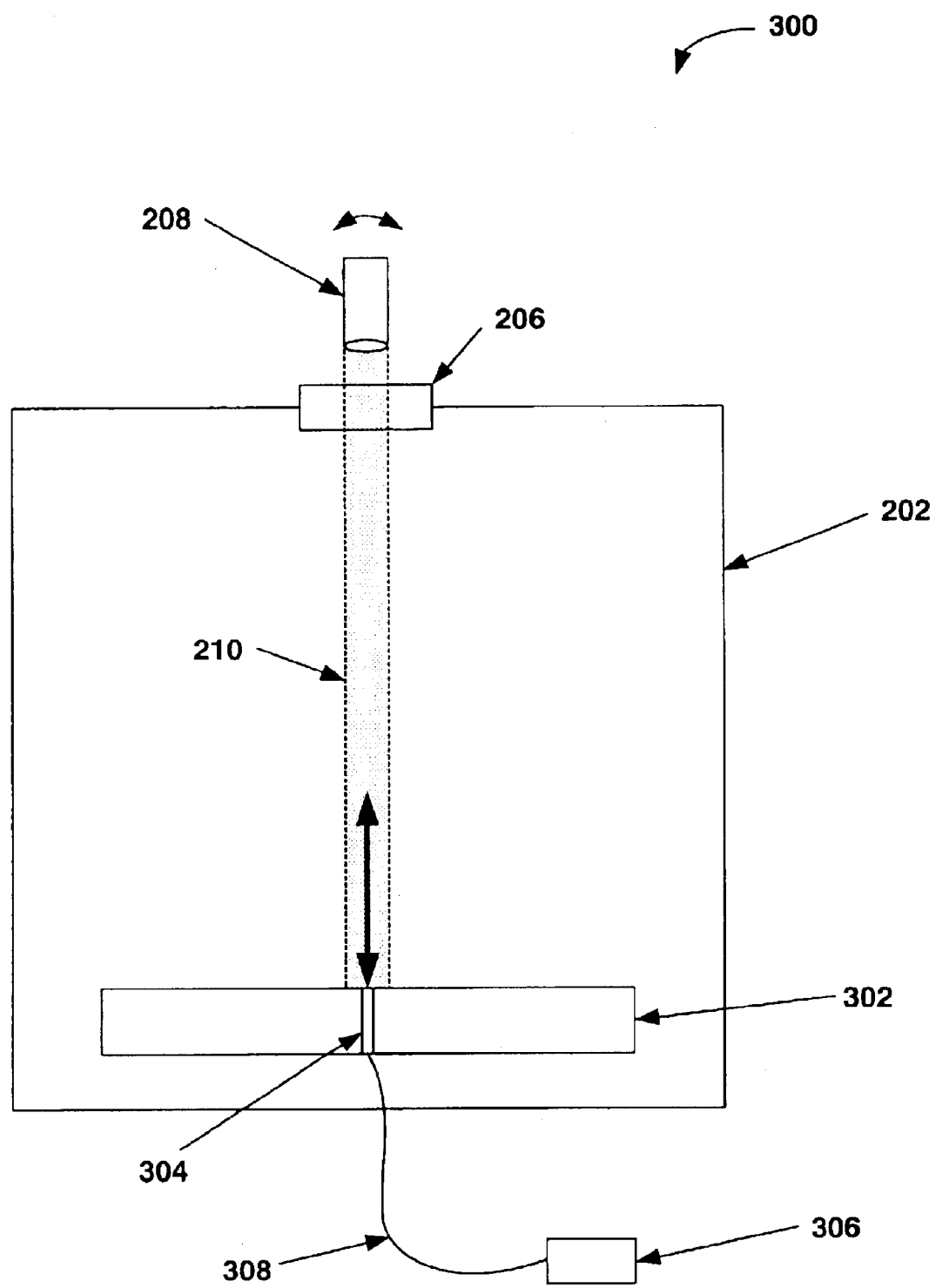
FIG. 3 is a diagram showing an etch system having an integrated multi-use optical alignment system based on transmittance, in accordance with an embodiment of the present invention.

In a further embodiment of the present invention, a transmittance based alignment feature can be used. FIG. 3 is a diagram showing an etch system 300 having an integrated multi-use optical alignment system based on transmittance, in accordance with an embodiment of the present invention. Similar to the system of FIG. 2, the etch system 300 includes a process chamber 202 having a view port 206 and a wafer chuck 302. However, in the embodiment of FIG. 3, the wafer chuck 302 includes a transmittance alignment feature 304 to facilitate alignment of the optical beam 210. As above, the view port 206 allows an optical beam 210 to be transmitted onto the surface of the wafer chuck 302 using a beam-forming system 208.

In the embodiment of FIG. 3, a small transmittance alignment feature 304 is formed in the center region of the wafer chuck 302. In one embodiment, the transmittance alignment feature 304 is parallel with the surface of the wafer chuck 302, thus mimicking the effect of having a wafer on the wafer chuck 302. As illustrated in FIG. 3, the axis of the transmittance alignment feature 304 is normal to the top surface of the wafer chuck 302. In addition, a light detector 306 is coupled to the transmittance alignment feature 304 via an optical fiber 308. The transmittance alignment feature 304 is a transparent, vacuum tight, high aspect ratio feature that allows light to be transmitted through the wafer chuck 302 when the beam-forming system 208 is properly aligned.

The high aspect ratio forces the optical beam 210 to be essentially normal to the surface of the wafer chuck 302 to allow light to be transmitted through the transmittance alignment feature 304 to the light detector 306 via the optical fiber 308. Thus, to properly align the optical beam 210 emitted from the beam-forming system 208, the optical beam 210 is emitted onto the transmittance alignment feature 304 on the surface of the wafer chuck 302. The light signal is transmitted through the transmittance alignment feature 304, and then to the light detector 306 through the wafer chuck 302. The beam-forming system 208 then is adjusted until the light transmitted through transmittance alignment feature 304 is maximized at all wavelengths being utilized.

As above, alignment of the beam-forming system 208 can be undertaken at anytime when the etch system 300 is idle. Because the transmittance alignment feature 304 is built into the wafer chuck 302, the alignment of the beam-forming system 208 can be checked, for example, each time a wafer is unloaded. Hence, as with the reflective alignment feature, the transmittance alignment feature 304 allows the beam-forming system 208 to be aligned without interrupting the normal process flow because the alignment can occur between wafer etch operations.

In addition to facilitating alignment of the beam-forming system, the transmittance alignment feature 304 can be utilized to take transmittance measurements through the production wafers. For example, the infrared spectrum can be used to measure the temperature of a wafer. If the wavelength range of the optical beam 210 encompasses the infrared spectrum, the transmittance alignment feature 304 can be used to transmit infrared signals to the detector 306 via the optical fiber 308. The infrared signals then can be analyzed to determine the temperature of the wafer.

Figure 4:
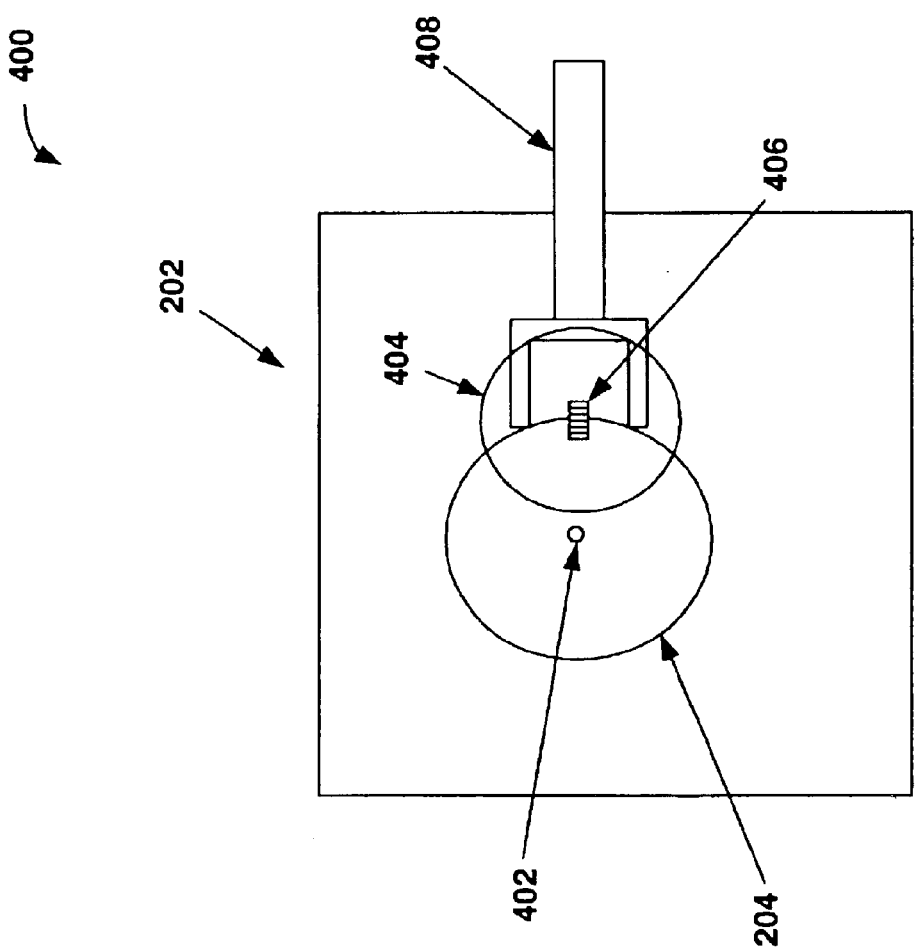
FIG. 4 is a diagram illustrating an etch system having integrated robot arm alignment functionality, in accordance with an embodiment of the present invention.

Furthermore, the integrated alignment feature in the wafer chuck allows the beam-forming system to be utilized as a metrology instrument that determines where a robot arm is located relative to the center of the wafer chuck. FIG. 4 is a diagram illustrating an etch system 400 having integrated robot arm alignment functionality, in accordance with an embodiment of the present invention. The etch system 400 includes a wafer chuck 204 having an integrated alignment feature 402 positioned in the center of the wafer chuck 204. As described above, the integrated alignment feature 402 can be a reflectance alignment feature as described with reference to FIG. 2, or a transmittance alignment feature as described with reference to FIG. 3. In either case, the integrated alignment feature 402 is utilized to align the beam-forming system such that the emitted optical beam is incident normal to the surface of the wafer chuck 204. A robot alignment wafer 404 having a reference pattern 406 is placed onto the robot arm 408 to facilitate alignment of the robot arm 408. The reference pattern 406 generally is formed in the central area of the robot alignment wafer 404. In one embodiment, the robot alignment wafer 404 can be loaded into a wafer cassette. After retrieving the robot alignment wafer 404 from the wafer cassette, the robot arm is inserted into the processing chamber 202.

In an etch system, the wafer chuck 204 defines the center of the processing environment. Because the integrated alignment feature 402 of the embodiments of the present invention is formed in the center of the wafer chuck 204, the coordinates of the center of the wafer chuck 204 are known to the wafer processing system. Once the optical beam is aligned with the integrated alignment feature 402 on the surface of wafer chuck 204, the optical beam can be utilized to detect the location of the reference pattern 406 on the robot alignment wafer 404 relative to the center of the wafer chuck 204. In particular, the reference pattern 406 on the robot alignment wafer 404 produces a variation in the optical beam that allows the system to calculate where the center of the reference pattern 406, and hence the center of the robot alignment wafer 404, is located relative to the center of the wafer chuck 204.

Figure 5A:
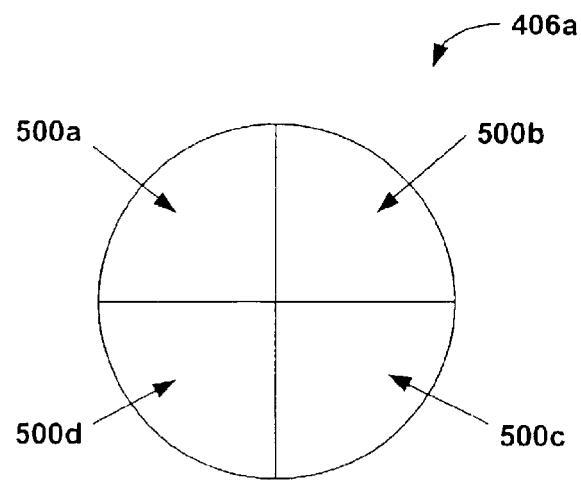
FIG. 5A is a diagram showing a circular spectral reference pattern for use with a robot alignment wafer, in accordance with an embodiment of the present invention.
Figure 5B:
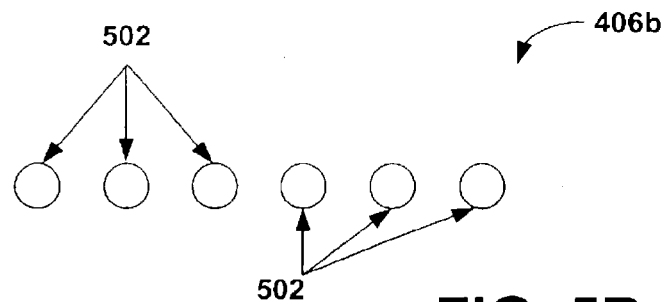
FIG. 5B is a diagram showing a linear aperture pattern for use with a robot alignment wafer, in accordance with an embodiment of the present invention.

FIGS. 5A–5B illustrate various reference patterns that can be utilized on the robot alignment wafer 404. FIG. 5A is a diagram showing a circular spectral reference pattern 406a for use with a robot alignment wafer, in accordance with an embodiment of the present invention. The circular spectral reference pattern 406a includes four quadrants 500a–500d, each having an optical bandpass filter centered at a unique wavelength. Although the circular spectral reference pattern 406a is illustrated using four quadrants, it should be noted that the circular spectral reference pattern 406a can be divided into any number of segments, with each segment having an optical bandpass filter centered at a unique wavelength.

In use, each quadrant 500a–500d transmits a different part of the spectrum of light, which then is reflected from or transmitted through the alignment feature on the wafer chuck. When the spectral balance of light detected in the optical beam indicates an equal amount from each bandpass filter, the center of the circular spectral reference pattern 406a is directly over the center of the wafer chuck. Otherwise, the spectral balance of the light detected in the optical beam indicates the offset of the center of the circular spectral reference pattern 406a relative the to the center of the wafer chuck.

FIG. 5B is a diagram showing a linear aperture pattern 406b for use with a robot alignment wafer, in accordance with an embodiment of the present invention. The linear aperture pattern 406b includes a series of circular apertures 502 in a line along the direction of travel of the robot arm when inserting the robot alignment wafer into the processing chamber. As the robot alignment wafer is inserted into the processing chamber, the optical beam will pass through each circular aperture 502 and either reflect back to the detector, when using a reflectance alignment feature, or travel to the detect via the transmittance cylinder and optical fiber, when using a transmittance alignment feature.

In either case the detector detects a peak in the optical beam signal as each circular aperture 502 is passed over the alignment feature. The amplitude of the detected peak is higher when center of a circular aperture 502 passes over the alignment feature, and lower when an edge of a circular aperture 502 passes over the alignment feature. As a result, the robot alignment system can calculate the position of the robot alignment wafer in two directions from the amplitude modulation of the optical beam signal. To increase accuracy in aligning the robot arm, multiple lines of linear aperture patterns can be utilized, as described next with reference to FIG. 5C.

Figure 5C:
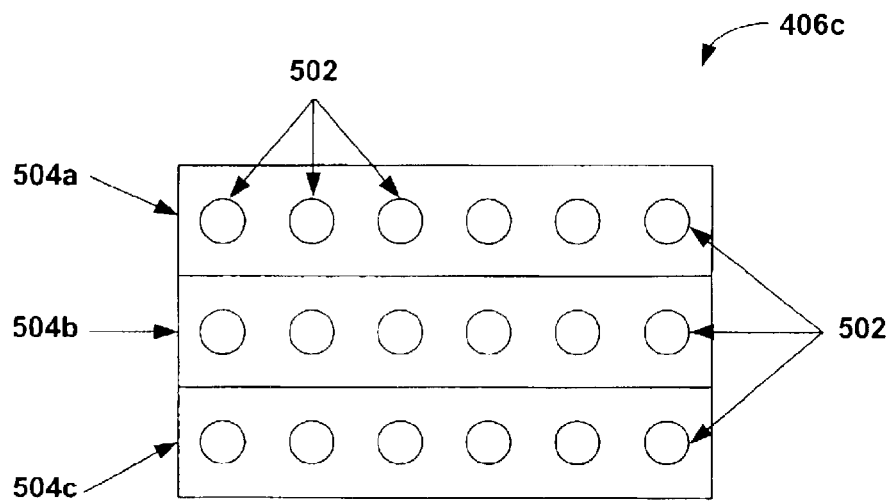
FIG. 5C is a diagram showing a multi-line linear aperture pattern for use with a robot alignment wafer, in accordance with an embodiment of the present invention.

FIG. 5C is a diagram showing a multi-line linear aperture pattern 406c for use with a robot alignment wafer, in accordance with an embodiment of the present invention. The multi-line linear aperture pattern 406c a plurality of linear aperture patterns 504a–504c, each including a series of circular apertures 502 in a line along the direction of travel of the robot arm when inserting the robot alignment wafer into the processing chamber. In addition, each linear aperture pattern 504a–504c is covered with an optical bandpass filter centered at a unique wavelength.

As above, the detector detects a peak in the optical beam signal as each circular aperture 502 is passed over the alignment feature. The amplitude of the detected peak is higher when center of a circular aperture 502 passes over the alignment feature, and lower when an edge of a circular aperture 502 passes over the alignment feature. As a result, the robot alignment system can calculate the position of the robot alignment wafer in two directions from the amplitude modulation of the optical beam signal.

In addition, the bandpass filters covering each linear aperture pattern 504a–504c can be utilized to calculate right and left offset relative to the central linear aperture pattern 504b, which is located at the center of the reference pattern 406c along the direction of travel of the robot arm when inserting the robot alignment wafer into the processing chamber. Each bandpass filter transmits a different part of the spectrum of light, which then is reflected from or transmitted through the alignment feature on the wafer chuck. Hence, the spectral balance of the light detected in the optical beam indicates the offset of the center of the reference pattern 406c relative the to the center of the wafer chuck.

In a further embodiment, the reference pattern can include a plurality of slits normal to the direction of travel of the robot arm when inserting the robot alignment wafer into the processing chamber. A continuous optical filter that varies transmission wavelength continually from one edge to the other covers the plurality of slits. As the slits cross the alignment feature on the wafer chuck, the optical signal is modulated only for the wavelengths of the optical signal that pass through the slits and filter and reach the alignment feature. In this manner, the upper and lower wavelength limits can be utilized to calculate offset to the left and right. Advantageously, this reference pattern can be utilized regardless of the optical beam uniformity.

The information calculated using the reference pattern on the robot alignment wafer is then utilized to send alignment coordinates to the robot control system. For example, the reference pattern can indicate the robot is a quarter of a millimeter to the left. Correction coordinates can then be generated and provided to the robot control system. In this manner, alignment of the robot arm can be performed without venting either the transport module or the process chamber.

Figure 6:
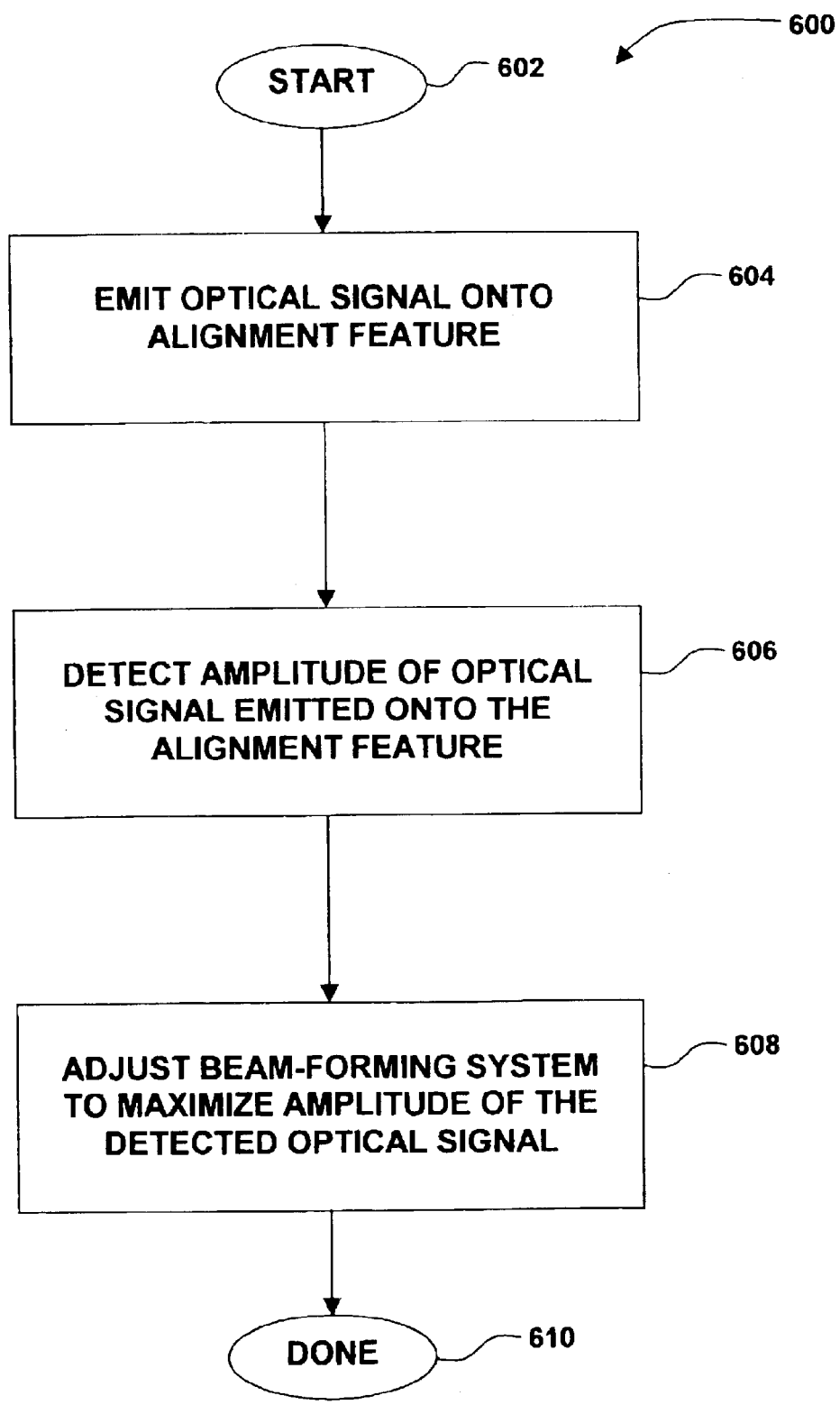
FIG. 6 is a flowchart showing a method for optical alignment in a semiconductor processing system, in accordance with an embodiment of the present invention.

FIG. 6 is a flowchart showing a method 600 for optical alignment in a semiconductor processing system, in accordance with an embodiment of the present invention. In an initial operation 602, preprocess operations are performed. Preprocess operations can include, for example, embedding an alignment feature into a wafer chuck, and other preprocess operations that will be apparent to those skilled in the art after a careful reading of the present disclosure.

In operation 604, an optical beam is emitted onto the alignment feature located at the center of the wafer chuck. As mentioned above, the alignment feature can be a reflective alignment feature or a transmittance alignment feature. The reflective alignment feature is formed parallel with the surface of the wafer chuck, thus mimicking the effect of having a wafer on the wafer chuck. As described with reference to FIG. 2, the reflective alignment feature can be formed by polishing a small region on the surface of the wafer chuck to be smooth, or can be a small cylinder of transparent optical material, such as sapphire.

In one embodiment, the transmittance alignment feature also is formed parallel with the surface of the wafer chuck, thus mimicking the effect of having a wafer on the wafer chuck. The axis of the transmittance alignment feature is normal to the top surface of the wafer chuck. In addition, a light detector is coupled to the transmittance alignment feature via an optical fiber. The transmittance alignment feature is a transparent, vacuum tight, high aspect ratio feature that allows light to be transmitted through the wafer chuck when the beam-forming system is properly aligned.

In operation 606, the wavelengths of the light emitted onto the alignment feature are detected. When using a reflective alignment feature, the optical beam is reflected from the reflective alignment feature back to the beam-forming system. In this embodiment, the beam-forming system general includes a light source and a light detection mechanism. For example, an optical fiber can be used to provide light to the beam-forming system, and another optical fiber can be used to receive the light reflected from the reflective alignment feature and provide the received light to a light detector. When using transmittance alignment feature, the high aspect ratio forces the optical beam to be essentially normal to the surface of the wafer chuck to allow light to be transmitted through the transmittance alignment feature to the light detector via the optical fiber. Thus, the light signal is transmitted through the transmittance alignment feature, and then to the light detector through the wafer chuck.

The beam-forming system then is adjusted to maximize the amplitudes of all wavelengths being detected, in operation 608. As the beam-forming system is adjusted, amplitudes of the detected wavelengths will increase as the optical beam approaches incident normal to the wafer chuck. As a result, when the amplitudes of the detected wavelengths are maximized, the optical beam is incident normal with the surface of the wafer chuck and the beam-forming system is properly aligned.

Post process operations are performed in operation 610. Post process operations can include, for example, further wafer processing, robot arm alignment, and other post process operations that will be apparent to those skilled in the art. In this manner, embodiments of the present invention allow alignment of the beam-forming system to be undertaken at anytime when the etch system is idle, such as between wafers or during a waferless clean operation Because the alignment feature is built into the wafer chuck, the alignment of the beam-forming system can be checked, for example, each time a wafer is unloaded. Hence, the beam-forming system can be aligned without interrupting the normal process flow because the alignment can occur between wafer etch operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An optical alignment system for use in a semiconductor processing system, comprising:
    a wafer chuck having an alignment feature disposed in a top surface of the wafer chuck, the alignment feature being located at about a center of the wafer chuck;
    a beam-forming system disposed above the wafer chuck, the beam-forming system capable of emitting an optical signal onto the alignment feature; and
    a detector capable of detecting an amplitude of the optical signal emitted onto the alignment feature.

2. An optical alignment system as recited in claim 1, wherein the alignment feature is a reflective alignment feature capable of reflecting a portion of the optical signal to the beam detector.

3. An optical alignment system as recited in claim 2, wherein the reflective alignment feature is a polished region of the top surface of the wafer chuck.

4. An optical alignment system as recited in claim 3, wherein the polished region is contiguous.

5. An optical alignment system as recited in claim 3, wherein the polished region is a pattern of polished sub-regions.

6. An optical alignment system as recited in claim 1, wherein the alignment feature is a transmittance alignment feature capable of allowing a portion of the optical signal to pass through the wafer chuck to the detector.

7. An optical alignment system as recited in claim 6, wherein the detector is disposed below the wafer chuck.

8. An optical alignment system as recited in claim 6, wherein the transmittance alignment feature is transparent.

9. A method for optical alignment in a semiconductor processing system, comprising the operations of:
    emitting an optical signal onto an alignment feature integrated into a wafer chuck, the alignment feature located at a center of the wafer chuck;
    detecting an amplitude of the optical signal emitted onto the alignment feature; and
    adjusting a beam-forming system to maximize an amplitude of the detected optical signal, the beam-forming system generating the optical signal.

10. A method as recited in claim 9, wherein the alignment feature is a reflective alignment feature that reflects a portion of the optical signal to a detector located with the beam-forming system.

11. A method as recited in claim 10, wherein the reflective alignment feature is a polished region of the top surface of the wafer chuck.

12. A method as recited in claim 11, wherein the polished region is contiguous.

13. A method as recited in claim 11, wherein the polished region is a pattern of polished sub-regions.

14. A method as recited in claim 9, wherein the alignment feature is a transmittance alignment feature capable of allowing a portion of the optical signal to pass through the wafer chuck to the detector.

15. A method as recited in claim 14, wherein the detector is disposed below the wafer chuck.

16. A method as recited in claim 15, wherein the transmittance alignment feature is transparent.

17. A system for aligning a robot arm for use in a semiconductor processing system, comprising:
    a wafer chuck having an alignment feature integrated into a top surface of the wafer chuck, the alignment feature located at a central location of the top surface of the wafer chuck;
    a beam-forming system disposed above the wafer chuck, the beam-forming system capable of emitting an optical signal onto the alignment feature;
    a robot alignment wafer having a reference pattern disposed in a central location of the robot alignment wafer, the robot alignment wafer being disposed on a robot arm; and
    a detector capable of detecting an amplitude of the optical signal emitted onto the reference pattern.

18. A system as recited in claim 17, wherein the reference pattern alters the optical signal such that a center of the robot alignment wafer can be determined relative to a center of the wafer chuck.

19. A system as recited in claim 18, wherein the reference pattern is a circular spectral reference pattern having a plurality of bandpass filters in separate segments of the circular spectral reference pattern, each bandpass filter centered at a unique wavelength.

20. A system as recited in claim 18, wherein the reference pattern is a linear aperture pattern having a plurality of circular apertures in a line along a direction of travel of the robot arm when the robot arm inserts the robot alignment wafer into a processing chamber.

21. A system as recited in claim 20, wherein the reference pattern is a mutli-line linear aperture pattern having a plurality of linear aperture patterns, each linear aperture pattern further including a bandpass filter centered at a unique wavelength.

* * * * *